United States Patent
Suppelsa et al.

[11] Patent Number: 5,411,199
[45] Date of Patent: May 2, 1995

[54] METHOD FOR ATTACHING A SHIELD

[75] Inventors: Anthony J. Suppelsa; Robert F. Darveaux; Thomas A. Goodwin, all of Coral Springs; Julio Abdala, Ft. Lauderdale; Henry F. Liebman, Tamarac, all of Fla.

[73] Assignee: Motorola, Inc., Schaumburg, Ill.

[21] Appl. No.: 206,693

[22] Filed: Mar. 7, 1994

[51] Int. Cl.6 .................................................. H05K 3/30
[52] U.S. Cl. .................................. 228/179.1; 228/177; 228/209; 228/254
[58] Field of Search .................. 228/179.1, 180.1, 177, 228/208, 209, 223, 254, 175

[56] References Cited
U.S. PATENT DOCUMENTS

| | | | |
|---|---|---|---|
| 3,649,803 | 3/1972 | Desmond et al. | 219/85 |
| 4,339,628 | 7/1982 | Marcantonio et al. | 361/376 |
| 5,357,404 | 10/1994 | Bright et al. | 361/818 |
| 5,358,774 | 10/1994 | Garvens | 428/209 |
| 5,371,404 | 12/1994 | Juskey et al. | 257/659 |

*Primary Examiner*—Samuel M. Heinrich
*Attorney, Agent, or Firm*—Pedro P. Hernandez

[57] ABSTRACT

A method for attaching a shield (102) to a an electronic assembly (116) having a heat sink (110) includes applying solder on the inner walls (104) of the shield (102). Next, the shield (102) is placed over the electronic assembly (116) such that the electronic assembly (116) is covered by the shield (102) and the shield (102) is in mechanical contact with the heat sink (110). Then, the shield (102) and heat sink (110) are heated so that the solder on the inner walls (104) of shield (102) flows and solders the shield (102) to the heat sink (110).

13 Claims, 2 Drawing Sheets

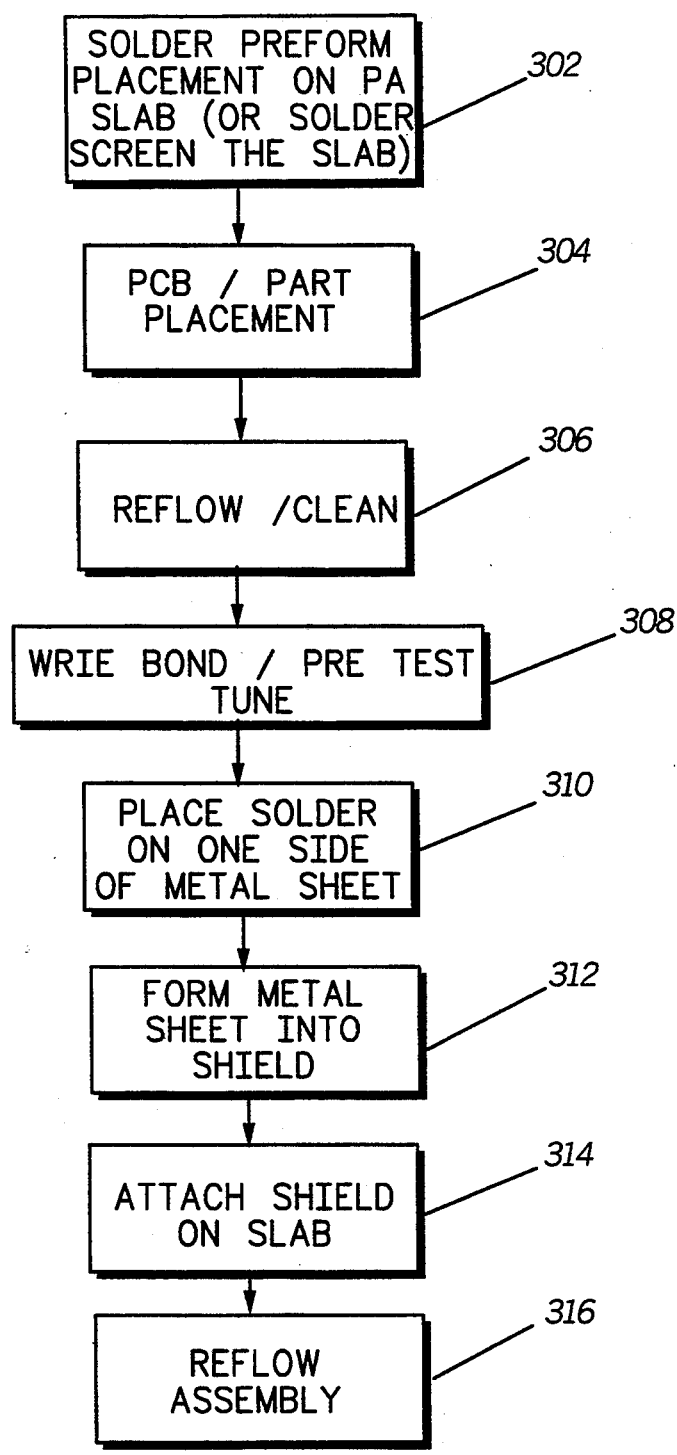

METHOD FOR ATTACHING A SHIELD

TECHNICAL FIELD

This invention relates in general to mechanical attachment processes and more specifically to a method for attaching a shield onto an electronic assembly.

BACKGROUND

Electronic assemblies used in two-way radios and other electronic devices which emit or are used in the vicinity of radio frequency and electromagnetic radiation, sometimes require shielding from electromagnetic and radio frequency interference (EMI and RFI). One such assembly is the radio frequency power amplifier module used in two-way radios. Present radio frequency power amplifier modules are typically manufactured by attaching the power amplifier substrate carrying the power amplifier electronics (e.g., power amplifier, etc.) onto a heat sink used to dissipate heat away from the amplifier using known attachment techniques, such as by soldering the substrate onto the heat sink or by using conductive adhesives. After the power amplifier substrate is attached to the heat sink, a metal shield is then attached to the heat sink using epoxy or other conductive adhesives which are applied to the joints between the shield and heat sink and then allowed to cure in an oven. The shield providing for an EMI/RFI protection to the power amplifier electronics.

One major problem of attaching the shield to the heat sink using the prior art method of epoxy application is that the process takes too much time. A typical shield attachment step using epoxy takes in the order of one and a half hours. Other problems associated with the use of epoxy to attach the shield to the module are problems with the conductive epoxy "running" into the power amplifier substrate during the time the epoxy is curing and causing electrical shorts to occur in the power amplifier circuit. Also, the epoxy while curing sometimes lifts the shield away from the power amplifier module due to a mismatch in the coefficient of expansion, causing a decrease in the amount of RFI/EMI attenuation provided by the shield. Finally, since conductive adhesives have to be cured under controlled conditions, a faulty adhesive curing process can cause the adhesive to fail and the shield to fall off the power amplifier module. A need thus exists in the art for a method for attaching a metallized shield onto an electronic assembly which can overcome the noted problems.

BRIEF DESCRIPTION OF THE DRAWINGS

FIG. 4 is a flow diagram of the shield attachment process in accordance with the invention.

DETAILED DESCRIPTION OF THE PREFERRED EMBODIMENT

Figure 1:
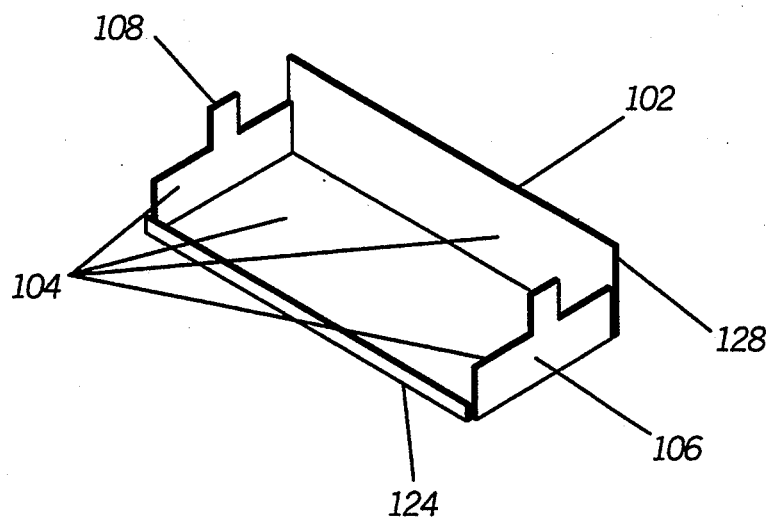
FIG. 1 is a metallized shield in accordance with the invention.

While the specification concludes with claims defining the features of the invention that are regarded as novel, it is believed that the invention will be better understood from a consideration of the following description in conjunction with the drawing figures, in which like reference numerals are carried forward.

Referring now to FIG. 1, a metal shield 102 in accordance with the invention is shown. Metal shield 102 includes outer surface 124 and inner surface 104 and side wall edges 128, as well as side support members 106 which include retention tabs 108. Shield 102 is formed by first disposing solder onto all the inner walls 104 of shield 102. This is preferably done before the shield is cut and stamped into shape, when the shield is still a flat sheet of metal, by cladding one side of the metal sheet with solder using one of a number of well known pre-solder flow cladding techniques. Once the inner walls 104 are cladded with solder, the shield 102 is then formed into shape by cutting and forming the metal sheet.

Figure 2:
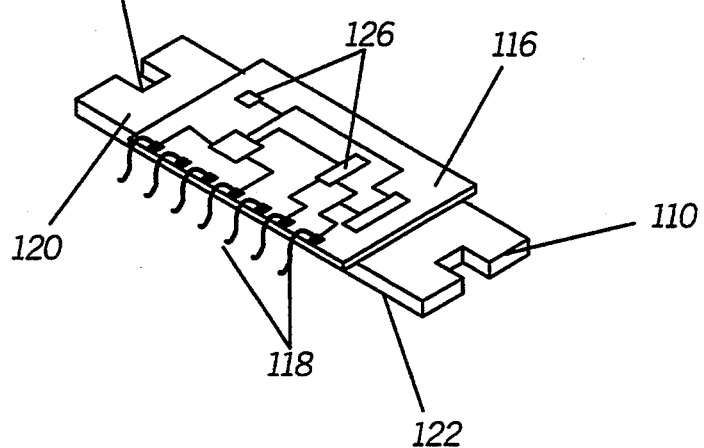
FIG. 2 shows a power amplifier substrate attached to a heat sink in accordance with the invention.

In FIG. 2, a power amplifier substrate 116 attached to a metal heat sink 110 in accordance with the invention is shown. Substrate 116 includes electronic components 126 such as a power amplifier, etc. Substrate 116 is preferably soldered onto heat sink 110 using a solder preform although one can attach substrate 116 to heat sink 110 using conductive adhesives or other known techniques. The solder preform used preferably will contain flux which will allow for ease of soldering. Typically, some of the ground potential points found in substrate 116 are soldered to heat sink 110, as well as the ground terminal of the power amplifier found in substrate 106 in order for the heat generated by the power amplifier to be dissipated away from the power amplifier via the heat sink 110. Substrate 116 includes a set of interconnection terminals 118 for electrically interconnecting the power amplifier module to other points in the radio which the module is a part of. Heat sink 110 includes a set of notches which are press fit onto tabs 108 of shield 102. Heat sink 110 is preferably formed from a piece of approximately 2 millimeter thick piece of copper which has its outer walls preferably tin-lead plated.

Figure 3:
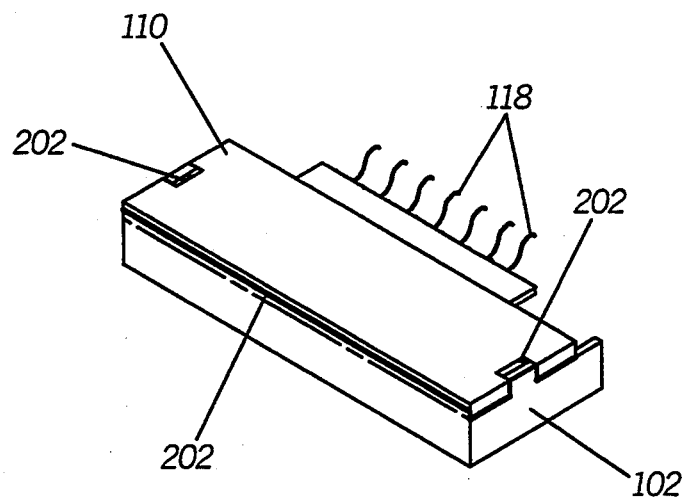
FIG. 3 shows a complete power amplifier assembly in accordance with the invention.

Referring now to FIG. 3, the power amplifier module is shown fully assembled. Substrate 116 is enclosed between the heat sink 110 and the shield 102. The joints (contact points) 202 between heat sink 110 and shield 102 are soldered in accordance with a shield attachment process which will be described in detail below. Preferably, in order to provide the maximum amount of attenuation to the electronic circuitry found in substrate 116 the joints 202 between shield 102 and heat sink 110, have to encase the substrate as much as possible, with the only opening in the module being for the interconnection terminals 118. Heat sink 110 should extend to all sides of shield 102 in order for the heat sink 110 and the shield 102 to provide maximum amount of encapsulation of substrate 116.

In FIG. 4, a method for attaching the shield 102 to the heat sink 110 in accordance with the invention is described. In step 302, a conventional solder preform is placed on one side of heat sink 110. Next, in step 304, the substrate 116 fully assembled with all the electronic components is placed on top of the solder preform. The assembly in step 306, is then sent through a conventional solder reflow oven and then the assembly is cleaned. This causes the substrate 116 to become soldered (attached) to heat sink 110. Instead of using a solder preform in step solder can be applied to the heat sink by screening the solder on the heat sink 110, or by using a number of other well known solder application techniques. In step 308, any wirebonds required by the assembly are attached and the assembly is electrically tested to ensure that the electronic assembly is functioning properly.

The forming of shield 102 in accordance with the invention is begun in step 310, by first disposing (cladding) solder on one side of a metal sheet such as a sheet of two millimeter thick sheet of nickel-silver alloy. Although the metal sheet can be formed from a number of other metals or alloys such as copper, copper-nickel-silver, or other metals which can be formed easily. Also as part of step 310, once the solder is cladded on the metal sheet, flux is applied by spraying or by use of other flux application methods onto the solder cladded side. In step 312, the solder cladded nickel-silver sheet is cut and formed into a shield (as shown in FIG. 1) using known forming and cutting techniques. The solder cladded side of the nickel-silver sheet forming the inner walls 104 of shield 102. Once the shield 102 is formed, in step 314 the shield 102 is press-fit to the heat sink 110 which has substrate 106 attached to it (as shown in FIG. 2). The assembly is then sent through another solder reflow step in order for the solder which is cladded on inner walls 104 of shield 102 and the solder cladded on heat sink 110 to flow and cover the joints 202 between shield 102 and heat sink 110. The flux which was applied to the inner walls 104 in step 310 enhances the flow of solder into the joints 202 since the flux flows into all of the joints 202 (contact points between the shield 102 and heat sink 110. Thereby providing a good solder joint to develop around all of the joints 202 between the shield 102 and the heat sink 110. Once the solder is reflowed, the joints 202 between shield 102 and heat sink 110 are soldered closed, and provide for a good EMI/RFI seal between the shield 102 and heat sink 110.

Although in the preferred embodiment, both the inner walls 104 of shield 102 and all of the heat sink 110 are solder cladded to enhance the flow of solder between the shield 102 and heat sink 110, one could solder clad (and also provide for an application of flux in the inner walls) only the the inner walls of shield 110. To provide for optimum reflow, one can fully solder clad all of the walls and edges of both shield 102 and heat sink 110. Furthermore, in some assemblies, instead of having two reflow steps (steps 306 and 316), one reflow step which solders the substrate onto the heat sink 110 and at the same time solders shield 102 to heat sink 110 can be done. In the case where only one solder reflow step is done, the substrate is laid on top of the heat sink 110 and then the shield is attached on top of the heat sink before the assembly is heated. The assembly is then sent through a solder reflow oven where the substrate 116 and shield 102 are soldered in the one reflow step to heat sink 110. Whether one or two solder reflow steps are required will depend on many factors such as the type and complexity of the electronic assembly being built, etc. In order to enhance the solderability of the assembly, heat sink 110 is preferably is plated with brite acid tin in order to enhance the solderability of heat sink 110.

The shield attachment process of the present invention provides for an improvement over the prior art method of using conductive epoxies to attach the shield 102 to heat sink 110. Furthermore, the present attachment process cuts down on the time it takes to attach the shield 102 to the heat sink 110, since no epoxy curing times are required. Also, the pre-cladded shield of the present invention provides for a more consistent welding of the joints 202 over using conductive epoxy due to the problems that epoxies have if the curing process is not done precisely (e.g., changes in temperature during the epoxy curing step can cause the epoxy to lift the shield away from the heat sink, or cause the adhesive not to properly cure).

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A method for forming a shielded assembly, comprising the steps of:
   providing a shield having inner and outer walls, the inner walls of the shield being cladded with solder;
   providing an electronic assembly having a substrate attached to a heat sink;
   placing the shield against the electronic assembly such that the substrate is substantially enclosed between the shield and heat sink and the shield and heat sink are in contact with each other; and
   heating the shield such that the solder found on the inner walls of the shield flows and solders the shield to the heat sink substantially about all the areas where the heat sink and shield are making contact with each other.

2. A method as defined in claim 1, comprising the further step of:
   applying flux to the inner walls of the shield before placing the shield against the heat sink.

3. A method as defined in claim 2, wherein the step of providing a shield comprises the steps of:
   providing a sheet of metal having first and second major opposed surfaces;
   applying solder onto the first major surface; and
   forming the sheet of metal into a shield having inner and outer walls such that the solder cladded first major surface forms the inner walls of the shield.

4. A method as defined in claim 3, wherein the step of providing an assembly further comprises the step of:
   solder cladding the heat sink.

5. A method as defined in claim 3, wherein the step of heating the shield comprises the step of solder reflowing the shield using a reflow oven.

6. A method of forming a shielded electronic module, comprising the steps of:
   providing a solder cladded heat sink having first and second major surfaces;
   providing a solder cladded shield;
   applying flux to the solder cladded shield;
   placing an electronic assembly on the solder cladded heat sink;
   placing the solder cladded shield over the electronic assembly such that it substantially encloses the electronic assembly and is in mechanical contact to the solder cladded heat sink at selected points; and
   heating the solder cladded shield and heat sink such that the shield and heat sink become soldered to each other at substantially all the selected points in which the shield and heat sink are in mechanical contact and the electronic assembly becomes soldered to the heat sink.

7. A method as defined in claim 6, wherein the step of heating comprises solder reflowing the shield and heat sink in a solder reflow oven.

8. A method as defined in claim 6, wherein the step of attaching the electronic assembly to the solder cladded heat sink comprises the steps of:

screening solder to one side of the heat sink;

placing the electronic assembly on top of the side of the heat sink which has solder; and heating the solder that is on the heat sink such that the electronic assembly becomes soldered to the heat sink.

9. A method as defined in claim 6, wherein the step of providing a solder cladded shield, comprises the steps of:

providing a sheet of metal having first and second major surfaces and side wall edges;

solder cladding the sheet of metal such that the first and second major surface and side wall edges of the shield are cladded with solder; and forming the sheet of metal into a shield.

10. A method as defined in claim 9, wherein the step of providing a solder cladded heat sink comprises the steps of:

forming a sheet of metal into the heat sink having outer walls; and plating the heat sink with brite acid tin.

11. A method of forming a shielded electronic module, comprising the steps of:

providing a solder cladded heat sink having first and second major surfaces;

providing a solder cladded shield;

applying flux to the solder cladded shield;

attaching an electronic assembly on the solder cladded heat sink;

placing the solder cladded shield over the electronic assembly such that it substantially encloses the electronic assembly and is in mechanical contact to the solder cladded heat sink at selected points; and heating the solder cladded shield and heat sink such that the shield and heat sink become soldered to each other at substantially all the selected points in which the shield and heat sink are in mechanical contact.

12. A method as defined in claim 11, wherein the step of heating comprises solder reflowing the shield and heat sink in a solder reflow oven.

13. A method as defined in claim 11, wherein the step of attaching the electronic assembly to the solder cladded heat sink comprises the steps of:

placing a solder preform on top of one side of the heat sink;

placing the electronic assembly on top of the solder preform; and heating the solder preform such that the electronic assembly becomes soldered to the heat sink.

* * * * *